(12) United States Patent
Wang et al.

(10) Patent No.: US 12,489,034 B2
(45) Date of Patent: Dec. 2, 2025

(54) CONTACT STRUCTURE AND METHOD OF FORMING THE SAME

(71) Applicant: Yangtze Memory Technologies Co., Ltd., Hubei (CN)

(72) Inventors: Yihuan Wang, Wuhan (CN); Lina Miao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 683 days.

(21) Appl. No.: 17/451,497

(22) Filed: Oct. 20, 2021

(65) Prior Publication Data

US 2023/0067727 A1 Mar. 2, 2023

Related U.S. Application Data

(63) Continuation of application No. PCT/CN2021/115290, filed on Aug. 30, 2021.

(51) Int. Cl.
*H01L 27/115* (2017.01)
*H01L 21/768* (2006.01)
(Continued)

(52) U.S. Cl.
CPC ...... *H01L 23/481* (2013.01); *H01L 21/76898* (2013.01); *H01L 23/5226* (2013.01);
(Continued)

(58) Field of Classification Search
CPC ........ H10B 43/27; H10B 41/35; H10B 41/41; H10B 41/27; H10B 43/35; H10B 43/40;
(Continued)

(56) References Cited

U.S. PATENT DOCUMENTS 6,118,505 A 9/2000 Nagata et al.
10,510,415 B1 * 12/2019 Huo ............ H01L 29/42384
(Continued)

FOREIGN PATENT DOCUMENTS

| CN | 111758164 A | 10/2020 |
|---|---|---|
| CN | 112567519 A | 3/2021 |
| JP | 2018-163970 A | 10/2018 |

OTHER PUBLICATIONS

International Search Report issued May 26, 2022 in PCT/CN2021/115290 filed on Aug. 30, 2021, 4 pages.
(Continued)

*Primary Examiner* — Ajay Ojha
*Assistant Examiner* — Tsz K Chiu
(74) *Attorney, Agent, or Firm* — Oblon, McClelland, Maier & Neustadt, L.L.P.

(57) ABSTRACT

A semiconductor device includes a first die including a first stack of layers in a first region on a backside of the first die and a second stack of layers in a second region on the backside of the first die. The first stack of layers has a smaller number of different layers than the second stack of layers. A contact structure is formed in the first region on the backside of the first die. The contact structure extends through the first stack of layers and is configured to conductively connect a first conductive structure on a face side of the first die with a second conductive structure on the backside of the first die. The face side is opposite to the backside.

20 Claims, 9 Drawing Sheets

(51) Int. Cl.
*H01L 23/00* (2006.01)
*H01L 23/48* (2006.01)
*H01L 23/522* (2006.01)
*H01L 25/00* (2006.01)
*H01L 25/065* (2023.01)
*H01L 27/11524* (2017.01)

(52) U.S. Cl.
CPC .............. *H01L 24/08* (2013.01); *H01L 24/80* (2013.01); *H01L 25/0657* (2013.01); *H01L 25/50* (2013.01); *H01L 2224/08145* (2013.01); *H01L 2224/80001* (2013.01)

(58) Field of Classification Search
CPC ..... H10B 43/10; H10B 43/50; H01L 23/5226; H01L 23/5283; H01L 21/76816; H01L 21/76865; H01L 21/76877; H01L 21/76831
See application file for complete search history.

(56) References Cited

U.S. PATENT DOCUMENTS

| | | | | |
|---|---|---|---|---|
| 10,553,599 | B1* | 2/2020 | Chen | H10B 43/10 |
| 10,892,269 | B2* | 1/2021 | Fukuzumi | H10B 43/40 |
| 11,177,271 | B2* | 11/2021 | Tessariol | H01L 21/76877 |
| 11,508,750 | B2* | 11/2022 | Zhang | H01L 24/29 |
| 11,856,765 | B2* | 12/2023 | Matsuno | H10B 43/27 |
| 12,136,618 | B2* | 11/2024 | Zhang | H01L 27/0688 |
| 2005/0189588 | A1* | 9/2005 | Ma | H01L 23/60 |
| | | | | 257/E21.597 |
| 2019/0273090 | A1* | 9/2019 | Fukuzumi | H01L 25/18 |
| 2020/0227397 | A1* | 7/2020 | Yada | H10B 43/40 |
| 2020/0266146 | A1* | 8/2020 | Nishida | H01L 23/5383 |
| 2020/0286815 | A1 | 9/2020 | Moriyama et al. | |
| 2021/0035965 | A1* | 2/2021 | Mizutani | H01L 25/18 |
| 2021/0036002 | A1 | 2/2021 | Lee | |

OTHER PUBLICATIONS

Japanese Office Action issued on Sep. 2, 2024 in the corresponding Japanese Patent Application No. 2023-557778, 6 pages.
Extended European Search Report issued on Jun. 14, 2024 in the corresponding European Application No. 21955326.0, 12 pages.
Office Action issued Jan. 7, 2025, in Japanese Patent Application No. 2023-557778 filed Aug. 30, 2021, 8 pages.

* cited by examiner

CONTACT STRUCTURE AND METHOD OF FORMING THE SAME

RELATED APPLICATION

This application is a bypass continuation of International Application No. PCT/CN2021/115290, filed on Aug. 30, 2021. The entire disclosure of the prior application is hereby incorporated by reference in its entirety.

TECHNICAL FIELD

The present application describes embodiments generally related to semiconductor devices and fabrication processes for semiconductor devices.

BACKGROUND

A memory device usually includes memory cell arrays and periphery circuits. In some examples, the memory cell arrays can be formed on a first die that is referred to as an array die, and the periphery circuits are formed on a second die that is referred to as a periphery die. The array die and the periphery die can be bonded to connect the periphery circuits with the memory cell arrays.

SUMMARY

Aspects of the disclosure provide a semiconductor device having a contact structure and a method of forming the same.

According to a first aspect, a semiconductor device is provided. The semiconductor device includes a first die. The first die includes a first stack of layers in a first region on a backside of the first die and a second stack of layers in a second region on the backside of the first die. The first stack of layers has a smaller number of different layers than the second stack of layers. A contact structure is formed in the first region on the backside of the first die. The contact structure extends through the first stack of layers and is configured to conductively connect a first conductive structure on a face side of the first die with a second conductive structure on the backside of the first die. The face side is opposite to the backside.

In some embodiments, the first stack of layers includes, in a sequence, a first layer, a replacement layer and a first insulating layer. The second stack of layers includes, in a sequence, the first layer, a second layer, a conductive layer, the replacement layer and the first insulating layer.

In some embodiments, the first layer and the replacement layer have equivalent etching properties. The second layer and the first layer have different etching properties. The conductive layer and the second layer have different etching properties. In some embodiments, the first layer and the replacement layer include a same conductive material. In some embodiments, the first layer includes doped silicon, and the replacement layer includes doped silicon.

In some embodiments, the contact structure includes a conductive portion and a sidewall portion. The conductive portion is configured to conductively connect with the first conductive structure. The sidewall portion is configured to insulate the conductive portion from the first stack of layers.

In some embodiments, the conductive portion includes at least one of tungsten or aluminum. In some embodiments, the sidewall portion includes at least one of silicon oxide, silicon nitride, zirconium oxide, hafnium oxide, aluminum oxide or tantalum oxide.

In some embodiments, the semiconductor device further includes memory cells on the face side of the first die and a second die bonded face-to-face with the first die. The second die includes a substrate and peripheral circuitry that is formed on a face side of the substrate for the memory cells. In some embodiments, the memory cells includes a third stack of alternating gate layers and second insulating layers on the face side of the first die, and a plurality of channel structures extending through the third stack.

In some embodiments, the semiconductor device further includes a second die bonded face-to-face with the first die. The second die includes memory cells formed on a face side of the second die. Peripheral circuitry is formed on the face side of the first die for the memory cells.

According to a second aspect of the disclosure, a method of fabricating a semiconductor device is provided. The method includes replacing, in a first region and from a backside of a first die, multiple layers in a stack of layers formed on the backside of the first die, with a replacement layer. A buffer layer is formed on the backside over the replacement layer. A contact hole is formed in the first region by etching the buffer layer and the replacement layer. The contact hole uncovers a first conductive structure formed on a face side of the first die. The face side is opposite to the backside.

In some embodiments, the replacing the multiple layers in the stack of layers formed on the backside of the first die with the replacement layer further includes forming, in the first region, a recess in the stack of layers with a first etch stop layer being a bottom of the recess. The replacement layer is deposited that fills the recess in the stack of layers and covers the stack of layers from the backside of the first die.

In some embodiments, the multiple layers in the stack of layers are replaced with the replacement layer having equivalent etching properties to the first etch stop layer in the stack of layers. In some embodiments, the replacement layer and the first etch stop layer are of a same material.

In some embodiments, an insulating portion of a contact structure is formed on a sidewall of the contact hole. A conductive portion of the contact structure is formed that fills the contact hole and connects with the first conductive structure.

In some embodiments, the forming the insulating portion of the contact structure on the sidewall of the contact hole further includes depositing an insulating material on the sidewall and a bottom of the contact hole. The insulating material is removed from the bottom of the contact hole.

In some embodiments, a second conductive structure is formed on the backside of the contact structure. The second conductive structure is electrically coupled with the first conductive structure via the contact structure.

In some embodiments, memory cells are formed on the face side of the first die. Peripheral circuitry for the memory cells is formed on a face side of a second die. The first die and the second die are bonded face-to-face.

According to a third aspect, a memory system is provided. The memory system includes a semiconductor device and a controller configured to control operations of the semiconductor device. The controller is connected with the semiconductor device. The semiconductor device includes a die including a contact structure disposed on a backside of the die. A first conductive structure is disposed on a face side of the die and connected with the contact structure from the face side of the die. The face side is opposite to the backside. A second conductive structure is disposed on the backside of the die and connected with the contact structure from the backside of the die. The contact structure is configured to conductively connect the first conductive structure with the second conductive structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor device can include multiple dies bonded together. In some fabrication technology, dies can be bonded at wafer level before the formation of pad structures. For example, a first wafer including multiples of a first die (e.g., an array die) and a second wafer including multiples of a second die (a periphery die) can be bonded face-to-face. Then, the bonded wafers are further processed, for example, to form pad structures on a back side of one of wafers, the pad structures are used for interfacing with external circuitry. In some examples, after the formation of the pad structures, the bonded wafers can be sawed into chips, and each chip can includes two dies (e.g., an array die and a periphery die) bonded together, and the pad structures are formed on the back side of one of the two dies.

While the pad structures are formed on the back side of one of the two dies, the pad structures can be connected to circuitry formed on the face sides of the two dies by conductive structures. Some conductive structures are formed by processing steps that operate on the face sides of the dies before bonding, and some conductive structures are formed by processing steps that operate on the back side of the one of the two dies.

According to some aspects of the disclosure, a contact structure can be formed from the backside of the one of the two dies, the contact structure can extend through various layers at the back of the die, and can conductively connect a conductive structure disposed on the face side of the die (e.g., the conductive structure is formed by processing steps that operate on the face sides of the die). In some examples, a layer in the various layers is a silicon layer, and the contact structure that extends through the various layers is referred to as a through-silicon contact (TSC) structure. In the following description, a TSC structure is used as an example to illustrate techniques to form the contact structure, and the techniques can be used to form contact structures that extend through various layers without a silicon layer.

It is noted that generally, circuitry, such as memory cell arrays, periphery circuitry and the like are disposed on a face side (also referred to as a front side in some examples) of a die, and the opposite side of the die is referred to as a backside. The face side and the backside are opposite sides of a die.

For ease of description, the end of the TSC structure connected with a pad structure on the back of the die is referred to as the backside of the TSC structure, and the end of the TSC structure connected with the conductive structure on the face side of the die is referred to as the face side of the TSC structure. The TSC structure can therefore function as a connection structure.

In order to form the TSC structure, in some examples, a through-silicon hole (TSH) is usually formed by etching through a stack of layers from the backside of the die before a conductive metal material is deposited in the TSH. The stack of layers can include different materials of different etching properties, such as different etch rates, etching orientation and the like. During an etching process to form the TSH, due to the difference in etching properties, the TSH may have an uneven sidewall, for example, at an interface of two materials of different etching properties.

In some examples, a TSH usually has a high aspect ratio, and a relatively smooth sidewall can be desirable for the TSH. An uneven sidewall of the TSH can be problematic for further processing. In some examples, due to other processing requirements, the stack of layers can have quite different etching properties. In an example, the stack of layers includes an insulation layer (a first layer), a conductive layer (a second layer), a second etch stop layer (a third layer) for etching the conductive layer, a first etch stop layer (a fourth layer) for etching the second etch stop layer, and the like. Generally, an etch stop layer is selected to have relatively large difference in etch properties from a layer being etched. Thus, the stack of layers includes three interfaces of relatively large difference of etching properties. Specifically, the first layer and the second layer have relatively large difference in etching properties, the second layer and the third layer have relatively large difference in etching properties, and the third layer and the fourth layer have large difference in etching properties. Due to differences in etching properties of the four different materials, it can be challenging to form a TSH with a smooth etching profile around the three interfaces on the sidewall of the TSH.

Aspects of the disclosure provide techniques to reduce the number of different materials in the stack of layers to be extended through by a TSC structure, and thus the TSC structure can be formed with a relatively smooth sidewall profile. In an example, the stack of layers to be extended through by the TSC structure includes two layers of different materials, and one interface is involved. As a result, in some examples, the etching process for forming the TSH is simplified, and more importantly, a smooth etching profile of the TSH is easier to obtain.

Figure 1:
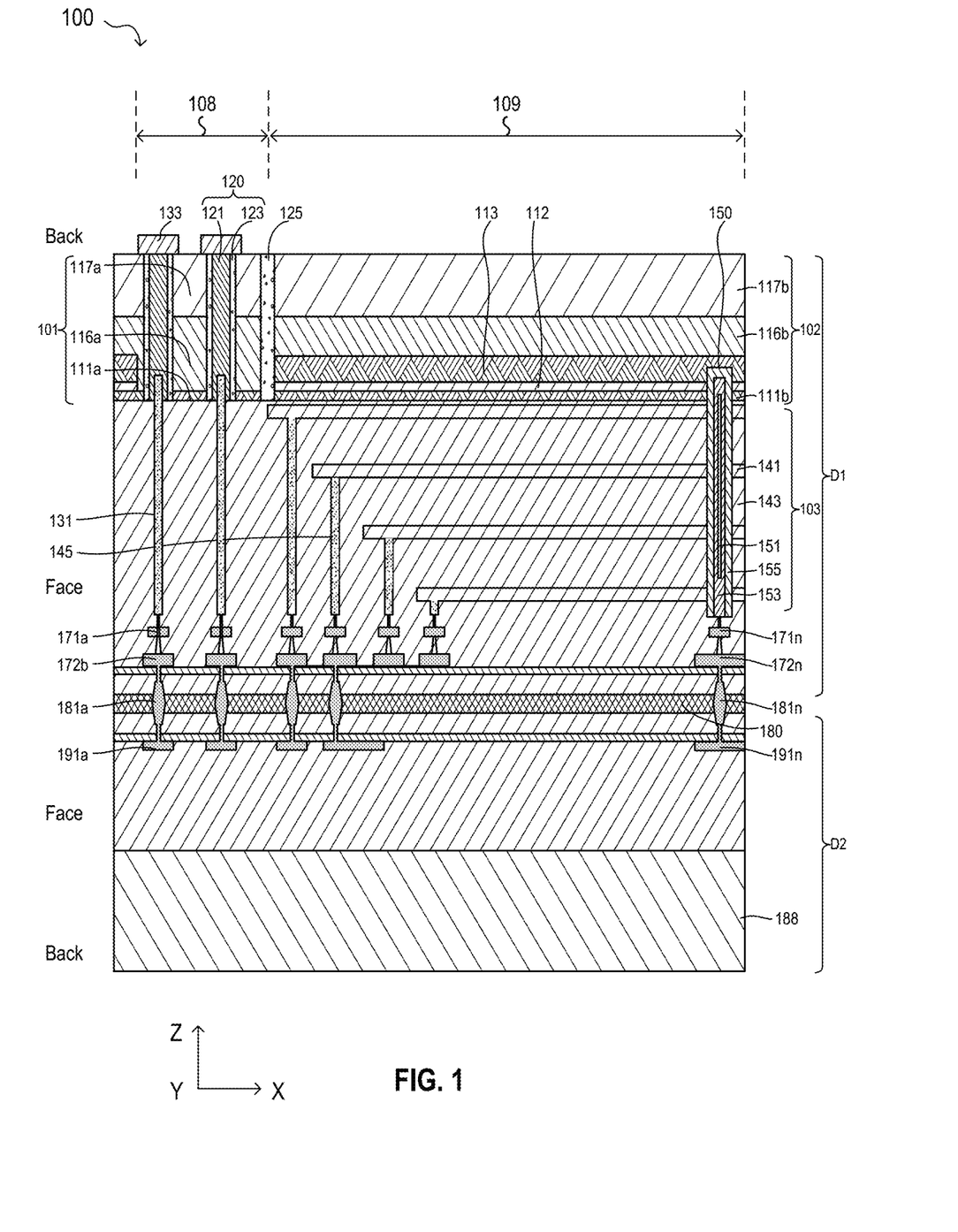
FIG. 1 is a cross-sectional view of a semiconductor device, in accordance with exemplary embodiments of the present disclosure.

FIG. 1 is a cross-sectional view of a semiconductor device 100, in accordance with exemplary embodiments of the present disclosure. As shown, the semiconductor device 100 can include a first die (or wafer) D1. The first die D1 has a backside and a face side that is opposite to the backside. The first die D1 can include a first stack 101 of layers in a first region 108 on the backside of the first die D1. The first die D1 can also include a second stack 102 of layers in a second region 109 on the backside of the first die D1. In some examples, the second stack 102 of layers is adjacent to the first stack 101 of layers and the second stack 102 of layers includes more layers of different material properties than the first stack 101 of layers. The first die D1 can further include at least one through-silicon contact (TSC) structure 120 that is formed in the first region 108 on the backside of the first die D1 and extends through the first stack 101 of layers. The at least one TSC structure 120 is configured to conductively connect a first conductive structure 131 on a face side of the first die D1 with a second conductive structure 133 on the backside of the first die D1.

In some embodiments, the first stack 101 of layers includes, in a sequence, a first layer 111 (shown by 111a, also referred to as a first etch stop layer), a replacement layer 116 (shown by 116a) and a first insulating layer 117 (shown by 117a). The second stack 102 of layers includes, in a sequence, the first layer 111 (shown by 111b), a second layer 112 (also referred to as a second etch stop layer), a conductive layer 113, the replacement layer 116 (shown by 116b), and the first insulating layer 117 (shown by 117b). In some embodiments, the first layer 111 and the replacement layer 116 have equivalent (e.g., similar or identical) etching properties. The second layer 112 and the first layer 111 have different etching properties. The conductive layer 113 and the second layer 112 have different etching properties.

Still referring to FIG. 1, the TSC structure 120 can include a conductive portion 121 and a sidewall portion 123 (also referred to an insulating portion). The conductive portion 121 is configured to conductively connect with the first conductive structure 131 on the face side and the second conductive structure 133 on the backside. As a result, the second conductive structure 133 can be electrically coupled to the first conductive structure 131 via the TSC structure 120. In one example, the second conductive structure 133 is configured to be a pad-out structure, and the conductive portion 121 includes a conductive metal material, such as tungsten, aluminum or the like. Note that in some examples, the first conductive structure 131 can extend into the conductive portion 121 to increase an area of contact between the first conductive structure 131 and the conductive portion 121.

The sidewall portion 123 of the TSC structure 120 is configured to isolate the conductive portion 121 from the first stack 101 of layers. In an example, the sidewall portion 123 is disposed between the conductive portion 121 and the first stack 101 of layers. The sidewall portion 123 can therefore function to electrically separate the conductive portion 121 from the first stack 101 of layers. Accordingly, the sidewall portion 123 can include an insulating material, such as silicon oxide, silicon nitride, zirconium oxide, hafnium oxide, aluminum oxide, tantalum oxide or the like.

As illustrated in FIG. 1, the TSC structure 120 extends through the first stack 101 of layers, including the first insulating layer 117, the replacement layer 116 and the first layer 111. In one embodiment, the replacement layer 116 and the first layer 111 include different materials and have an interface in between. Thus, the TSC structure 120 extends through three layers of different materials and two interfaces. In another embodiment, the replacement layer 116 and the first layer 111 include a same conductive material without etching difference, and thus no uneven interface may be caused by etching. Thus, the TSC structure 120 extends through two layers of different materials and one interface. For example, the same conductive material can be a silicon material (e.g. doped polysilicon, doped non-crystalline silicon or doped nano-silicon) or a conductive metal material.

Further, in some embodiments, the semiconductor device 100 can include a shielding structure 125 that is formed on the backside of the first die D1. The shielding structure 125 extends through at least one of the first stack 101 or the second stack 102. In the example of FIG. 1, the shielding structure 125 is arranged on the boundary of the first region 108 and the second region 109. As shown, the shielding structure 125 can have a high aspect ratio. Particularly, in an example, the TSC structure 120 is wider than the shielding structure 125 in the X-Y plane. In addition, the shielding structure 125 can include an insulating material so as to electrically isolate the second stack 102. In one example, the shielding structure 125 and the sidewall portion 123 of the TSC structure 120 can include a same insulating material.

Still referring to FIG. 1, the semiconductor device 100 can further include memory cells formed on the face side of the first die D1. In some embodiments, the memory cells include 3D NAND memory cells. In a non-limiting example, a third stack 103 of alternating word line layers 141 (also referred to as gate layers) and second insulating layers 143 is disposed on the face side of the first die D1. The third stack 103 of layers can include an array region where at least one channel structure 150 is formed and extends through the third stack 103. The alternating word line layers 141 and second insulating layers 143 and the channel structure 150 can form a stack of transistors, such as a vertical memory cell string. The alternating word line layers 141 and second insulating layers 143 and an array of the channel structures 150 can form an array of vertical memory cell strings. In some examples, the stack of transistors can include memory cells and select transistors, such as one or more bottom select transistors, one or more top select transistors, and the like. In some examples, the stack of transistors can also include one or more dummy select transistors.

The second insulating layers 143 can include one or more insulating materials, such as silicon nitride, silicon oxide, and the like. The word line layers 141 can include a gate stack of materials, such as high dielectric constant (high-k) gate insulator layers, metal gate electrode, and the like. The channel structure 150 can include a channel layer 153 (e.g. polysilicon), surrounded by one or more third insulating layers 155, such as a tunneling layer (e.g. silicon oxide), a charge trapping layer (e.g. silicon nitride), and a barrier layer (e.g. silicon oxide) that can together form an oxide-nitrideoxide (ONO) structure surrounding the channel layer 153. The channel structure 150 can further include a space 151 within the channel layer 153. The space 151 may be void or filled with an insulating material.

In one embodiment, the first layer 111 (shown by 111b) in the second region 109 is configured to be a source connection layer that serves as a common source line or electrically connects the channel layer 153 to a source region of the semiconductor device 100. Accordingly, a portion of the one or more third insulating layers 155 is removed so that the first layer 111 is in direct contact with the channel layer 153. For example, this can be accomplished by an SWS technology as disclosed in Applicant's co-pending patent application Ser. No. 17/113,662, filed on Dec. 7, 2020, entitled "TWO-STEP L-SHAPED SELECTIVE EPITAXIAL GROWTH", the entire content of which is incorporated here by reference.

Further, the third stack 103 can have a staircase region where a plurality of gate contact structures 145 is formed. The gate contact structures 145 are connected to the word line layers 141.

Still referring to FIG. 1, the semiconductor device 100 can include a second die (or wafer) D2 bonded to the first die D1 via a bonding interface 180 in a face-to-face fashion (a circuitry side is face, and a substrate side is back). Accordingly, the second die D2 also has a face side and a backside opposite the face side. The second die D2 includes a substrate 188 and peripheral circuitry (e.g. an address decoder, a driving circuit, a sense amplifier, and the like) formed on the face side of the substrate 188 for the memory cells. Note that the first die D1 initially includes a substrate, over which the memory cells are formed. The substrate of the first die D1 is removed prior to the formation of the TSC structure 120 in some examples.

Structures in the first die D1 can be electrically coupled with structures in the second die D2 via contact structures in the first die D1, metal layers (e.g. 171 and 172 shown as 171a, 171n, 172a, 172n, etc.) in the first die D1, bonding structures 181 (shown as 181a, 181n, etc.) at the bonding interface 180, metal layers (e.g. 191 shown as 191a, 191n, etc.) in the second die D2 and contact structures (not shown) in the second die D2. For example, the channel structure 150 can be electrically connected to a structure of the peripheral circuitry in the second D2 via the metal layers 171n and 172n, the bonding structures 181n and the metal layer 191n. Similarly, the first conductive structure 131 can be electrically connected to another structure (e.g. an input/output circuit) of the peripheral circuitry in the second D2 via the metal layers 171a and 172a, the bonding structures 181a and the metal layer 191a. As a result, in some examples, the second conductive structure 133 can be electrically connected to the input/output circuit via the TSC structure 120 and the first conductive structure 131.

In the example of FIG. 1, the first die D1 includes the memory cells, and the second die D2 includes the peripheral circuitry. Generally, the peripheral circuitry of the second die D2 can interface the memory cells with external circuitry. For example, the peripheral circuitry receives instructions from the external circuitry via the second conductive structures 133, provides control signals to the memory cells, receives data from the memory cells, and outputs data to the external circuitry via the second conductive structures 133.

In some embodiments, the semiconductor device 100 can include multiple array dies (e.g. the first die D0 and a CMOS die (e.g. the second die D2). The multiple array dies and the CMOS die can be stacked and bonded together. Each array die is coupled to the CMOS die, and the CMOS die can drive the array dies individually or together in a similar manner. Further, in some embodiments, the semiconductor device 100 includes at least a first wafer and a second wafer bonded face to face. The first die D1 is disposed with other array dies like D1 on the first wafer, and the second die D2 is disposed with other CMOS dies like D2 on the second wafer. The first wafer and the second wafer are bonded together so that the array dies on the first wafer are bonded with corresponding CMOS dies on the second wafer.

In alternative embodiments, the second die D2 can include memory cells, and the first die D1 can include peripheral circuitry for the memory cells (not shown). Similarly, the peripheral circuitry is coupled with the memory cells via contact structures in the first die, a bonding interface between the first die and the second die, and contact structures in the second die. Particularly, the second conductive structure 133 can still be disposed on the backside of the first die D1 and coupled with an input/output circuit of the peripheral circuitry via the first conductive structure 131.

FIGS. 2A, 2B, 2C, 2D, 2E and 2F are cross-sectional views of a semiconductor device 100' at various intermediate steps of manufacturing, in accordance with exemplary embodiments of the present disclosure. In some embodiments, the semiconductor device 100' can eventually become the semiconductor device 100.

Figure 2A:
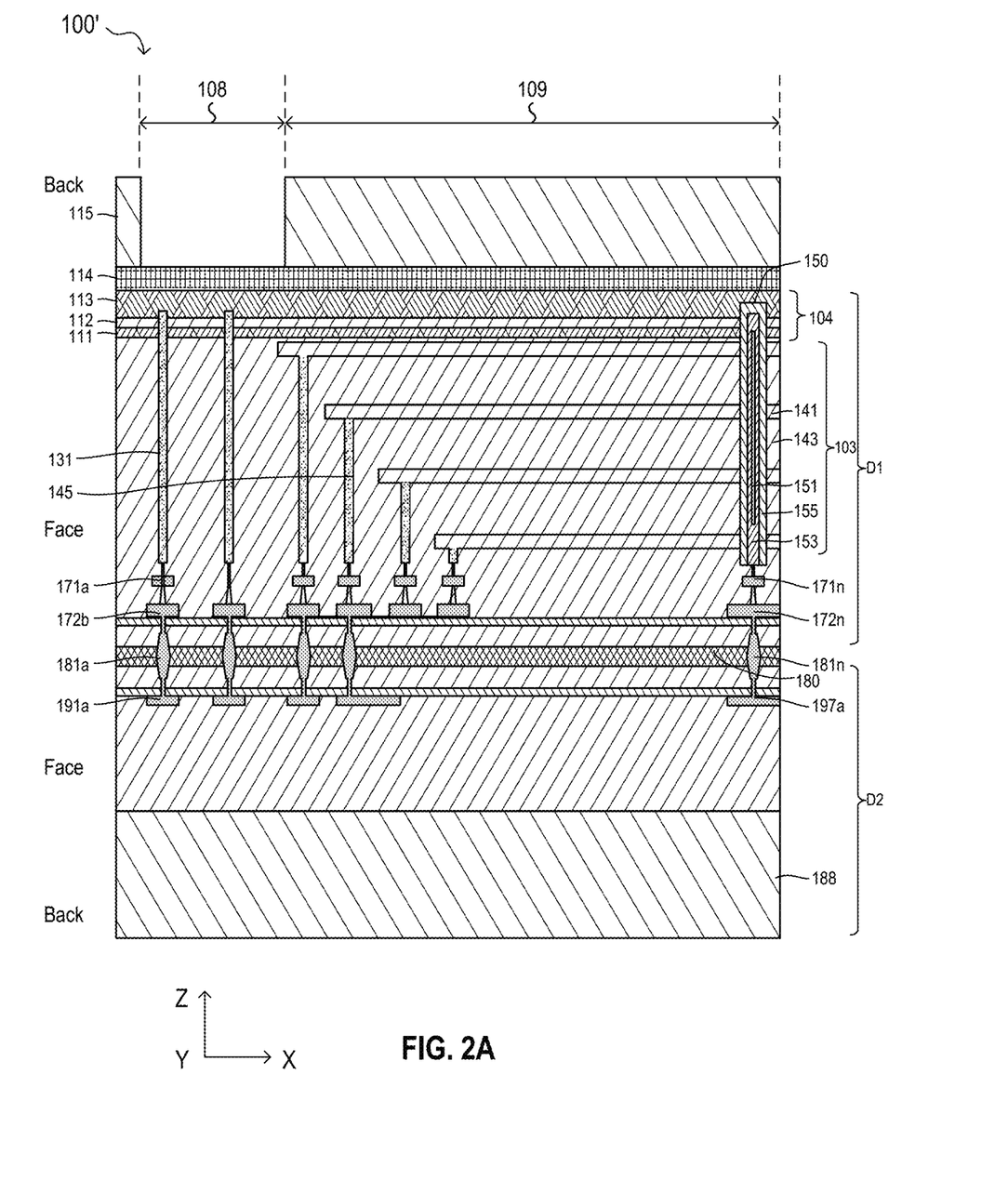
FIGS. 2A, 2B, 2C, 2D, 2E and 2F are cross-sectional views of a semiconductor device at various intermediate steps of manufacturing, in accordance with exemplary embodiments of the present disclosure.

As shown, embodiments of the semiconductor device 100' in FIG. 2A are similar to embodiments of the semiconductor device 100 in FIG. 1. Descriptions have been provided above, and explanations herein will be given with emphasis placed on differences. For example, the semiconductor device 100' can include a fourth stack 104 of layers formed on the backside of the first die D1. The fourth stack 104 of layers includes the first etch stop layer 111, the second etch stop layer 112 and the conductive layer 113. The first conductive structure 131 may extend into the fourth stack 104 by a penetration depth. Specifically, the first conductive structure 131 extends through the first etch stop layer 111 and the second etch stop layer 112 and extends into the conductive layer 113 in the example of FIG. 2A. Note that the penetration depth of the first conductive structure 131 is related to an area of contact with a future TSC structure (e.g. the TSC structure 120 in FIG. 1) and thus may vary in other examples.

In some embodiments, a hard mask layer 114 can be formed on the backside of the fourth stack 104. A photoresist layer 115 can be formed on the backside of the hard mask layer 114. The photoresist layer 115 is patterned so that a portion of the hard mask layer 114 is exposed in the first region 108. In one example, the hard mask layer 114 includes at least one of silicon oxide, silicon nitride or carbon.

Figure 2B:
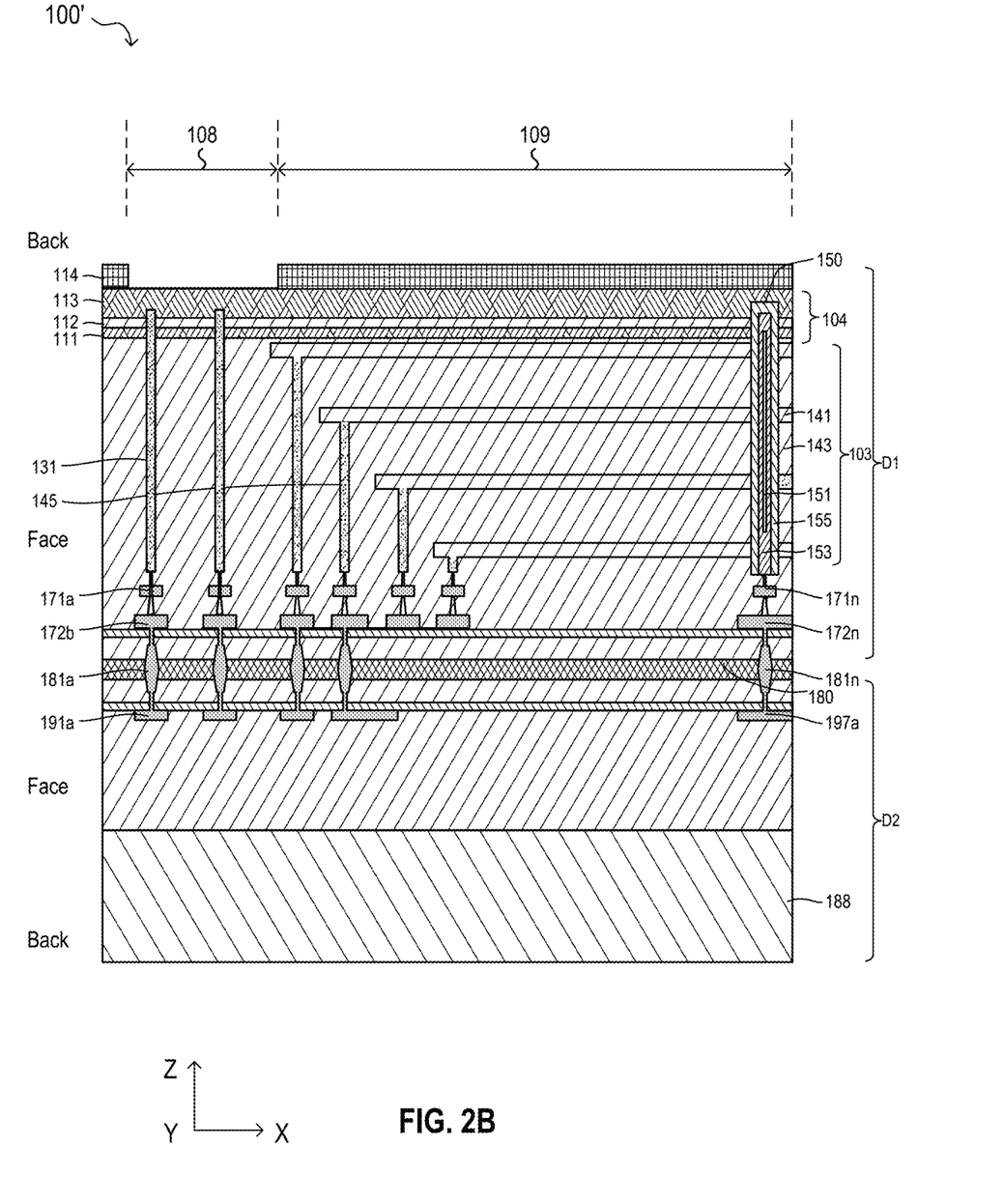

FIG. 2B shows the semiconductor device 100' after a pattern is transferred from the photoresist layer 115 to the hard mask layer 114. This pattern transfer can be accomplished by etching the portion of the hard mask layer 114 exposed in the first region 108 using the photoresist layer 115 as an etching mask. The photoresist layer 115 is then removed. As a result, a portion of the conductive layer 113 is exposed in the first region 108.

Figure 2C:
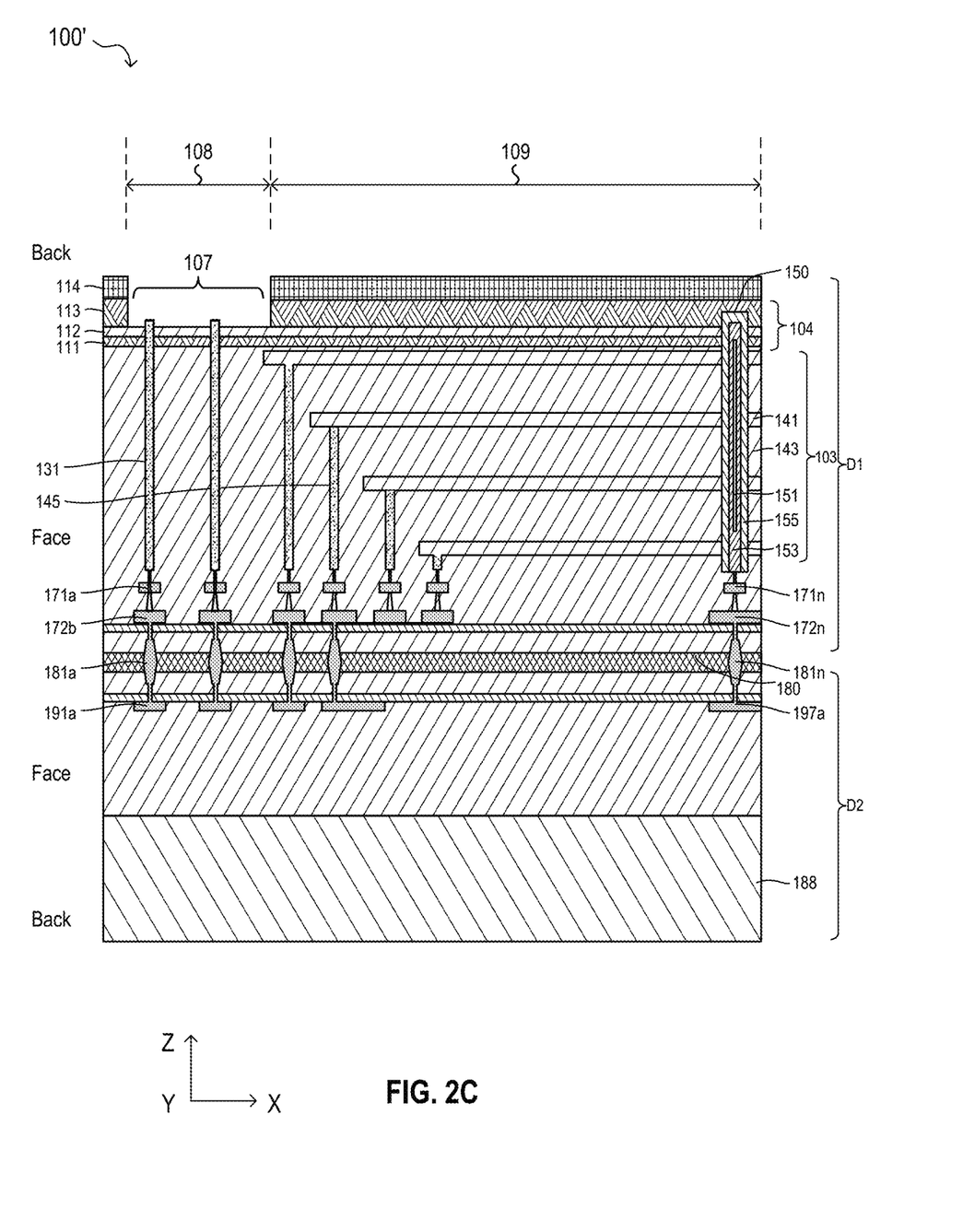

FIG. 2C shows the semiconductor device 100' after the portion of the conductive layer 113 exposed in the first region 108 is removed. This can be accomplished by etching the portion of the conductive layer 113 using the hard mask layer 114 as an etching mask and using the second etch stop layer 112 to determine an endpoint of etching. As a result, a portion of the second etch stop layer 112 is exposed in the first region 108, and a recess 107 is formed within the fourth stack 104. In the example of FIG. 2C, the first conductive structure 131 is also exposed from the backside. As discussed in FIG. 2A, the penetration depth of the first conductive structure 131 can vary in other examples. Thus, the first conductive structure 131 may or may not be exposed in other examples.

Figure 2D:
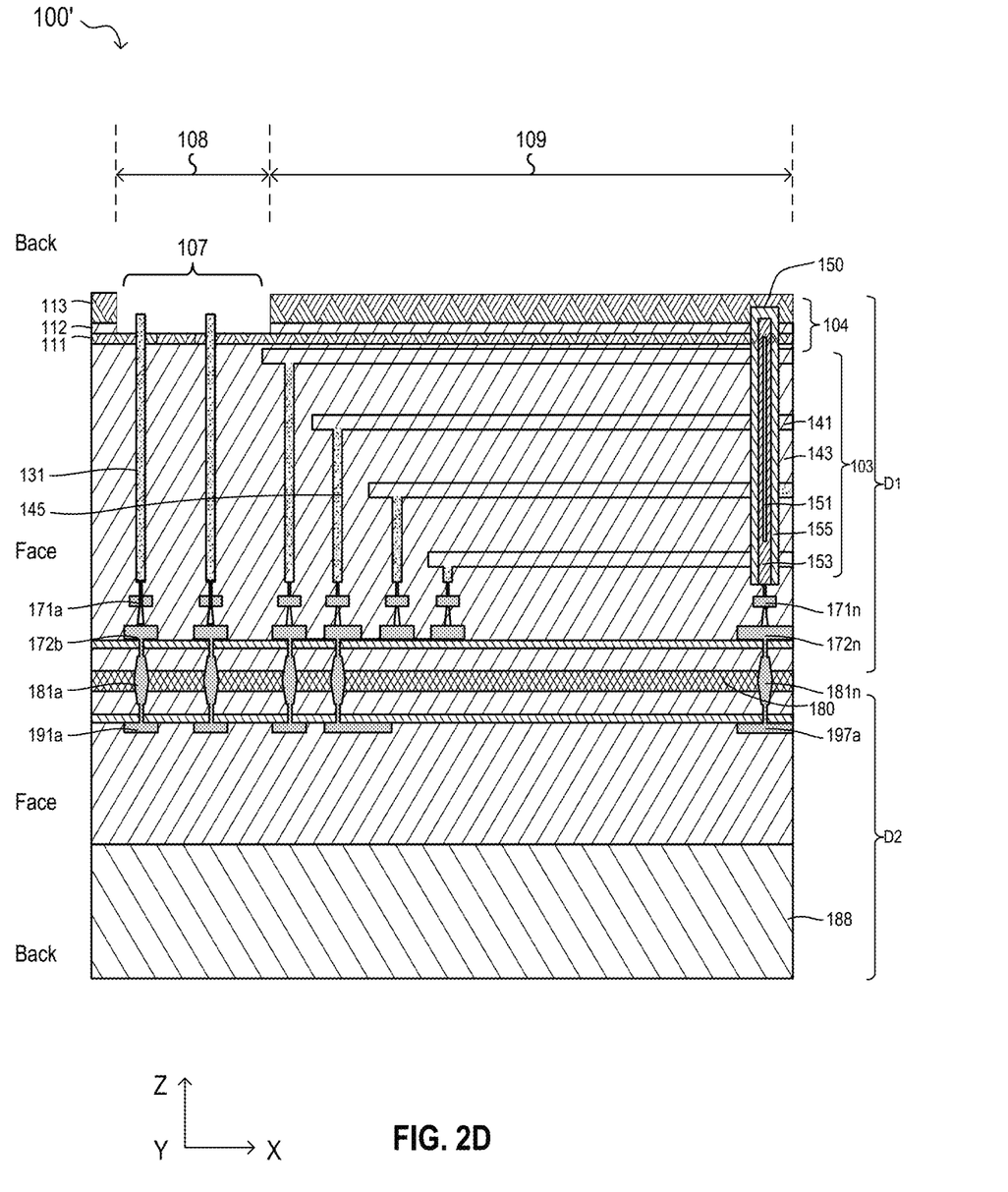

In FIG. 2D, the portion of the second etch stop layer 112 exposed in the first region 108 is etched away using the hard mask layer 114 as an etching mask, and the hard mask layer 114 is also removed. Note that the hard mask layer 114 can be etched while or after the portion of the second etch stop layer 112 is etched. For example, the second etch stop layer 112 can include silicon oxide, silicon nitride, and/or the like. The hard mask layer 114 can include at least one of silicon oxide, silicon nitride or carbon. In one embodiment, the hard mask layer 114 and the second etch stop layer 112 are both made of silicon oxide so that the hard mask layer 114 and the portion of the second etch stop layer 112 can be etched in a same etching process. In another embodiment, the hard mask layer 114 includes silicon oxide while the second etch stop layer 112 includes silicon nitride. In an example, the portion of the second etch stop layer 112 is etched before the hard mask layer 114 is etched.

Note that FIGS. 2A-2D show an example of forming the recess 107 in the fourth stack 104 in the first region 108. It should be understood that other patterning and/or etching processes can be designed and executed to form the recess 107 in the first region 108.

Figure 2E:
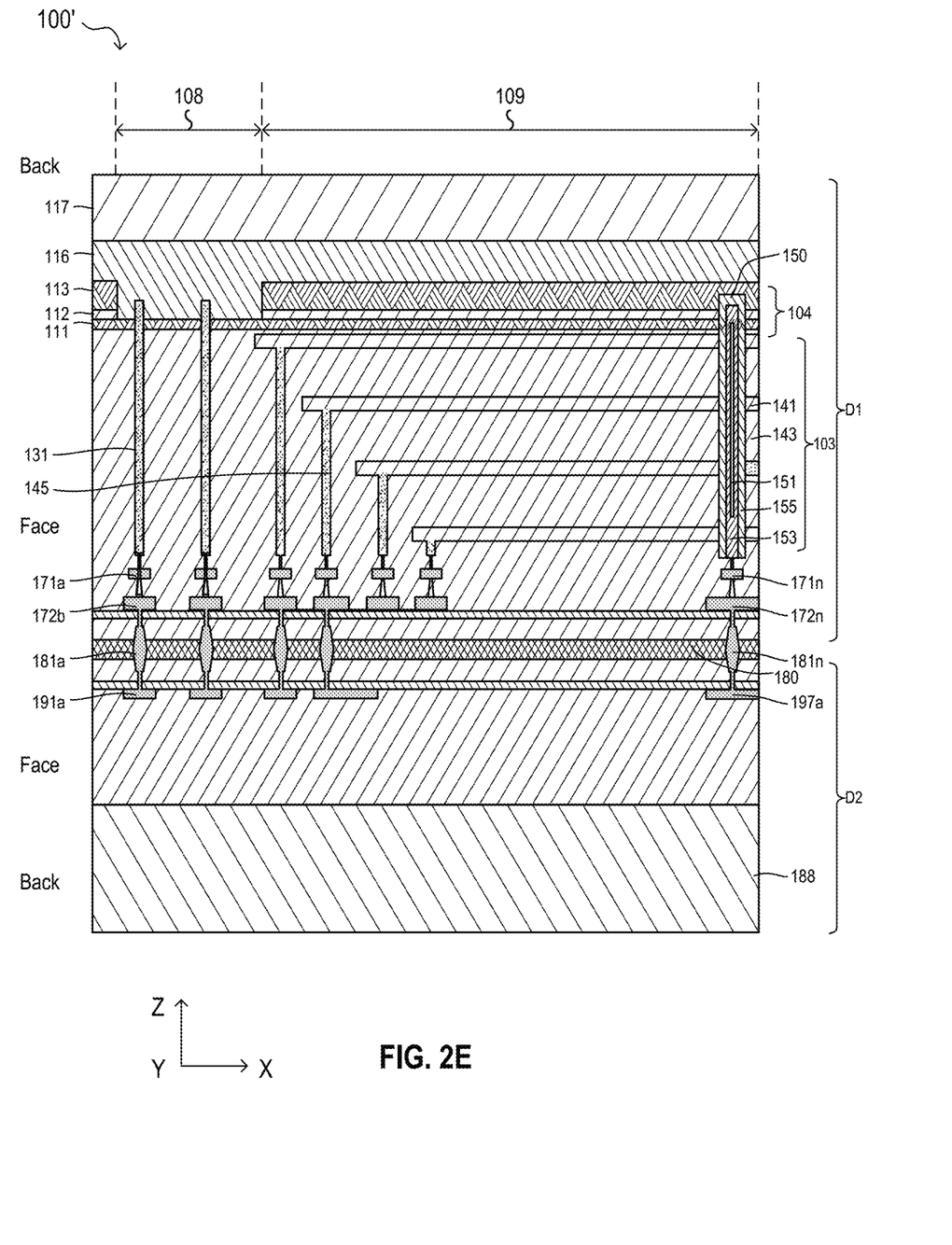

In FIG. 2E, a replacement layer 116 is formed from the backside of the first die D1. The replacement layer 116 fills the recess 107 and covers the fourth stack 104 from the backside of the first die D1. In an example, the replacement layer 116 can be planarized by chemical-mechanical polishing (CMP) from the backside of the first die D1. In some embodiments, the replacement layer 116 includes a conductive material. For example, the conductive material can be selected such that the replacement layer 116 and the first etch stop layer 111 have equivalent (e.g., similar or identical) etching properties. During a future etching process, a smooth etching profile can be obtained around an interface between the replacement layer 116 and the first etch stop layer 111. In some embodiments, the replacement layer 116 and the first etch stop layer 111 include a same conductive material and are formed with no interface in between. For example, the replacement layer 116 and the first etch stop layer 111 can include a silicon material (e.g. doped polysilicon, doped non-crystalline silicon or doped nano-silicon) or a conductive metal material.

Still referring to FIG. 2E, the first insulating layer 117 (also referred to as a buffer layer) is formed on the backside of the replacement layer 116. The first insulating layer 117 can include an insulating material, such as silicon oxide. The first insulating layer 117 can be used to function as a buffer layer and stabilize etching conditions during a future etching process.

Figure 2F:
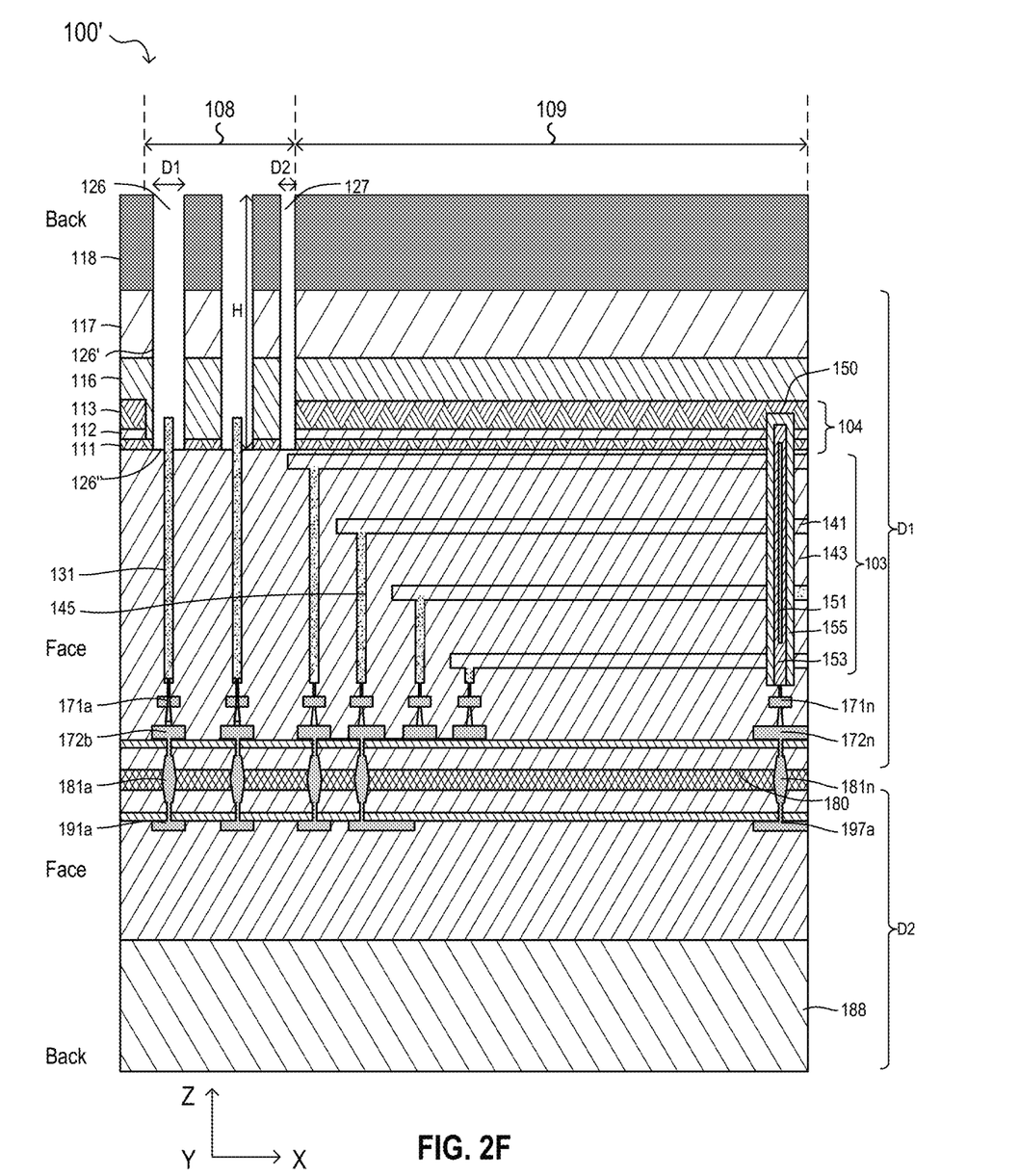

In FIG. 2F, at least one through-silicon hole (TSH) 126 (also known as a contact hole) is formed in the first region 108. The at least one TSH 126 extends through the first insulating layer 117, the replacement layer 116 and the first etch stop layer 111 of the fourth stack 104 of layers. The TSH 126 exposes the first conductive structure 131 from the backside of the first die D1. In some embodiments, an opening 127 may also be formed in the first region 108. The TSH 126 and the opening 127 have a depth H. The TSH 126 has a width D1, and the opening 127 has a width D2. In some examples, D1 can be larger than D2. The TSH 126 and the opening 127 can be formed in a same patterning process using a photoresist layer 118 as a mask. Further, the opening 127 can have a high aspect ratio in a cross section in the xz plane. The opening 127 may be a trench that extends in the y direction.

While not shown, in some embodiments, a through-silicon contact (TSC) structure, such as the TSC structure 120 in FIG. 1, can be formed in the TSH 126 and contact the first conductive structure 131. In some embodiments, a sidewall portion 123 of the TSC structure 120 is formed on a sidewall 126' of the TSH 126, and a conductive portion 121 of the TSC structure 120 is formed to fill the TSH 126. For example, an insulating material can be deposited on the sidewall 126' and a bottom 126" of the TSH 126. Then, the insulating material is removed from the bottom 126" of the TSH 126 so that the insulating material on the sidewall 126' of the TSH 126 forms the sidewall portion 123 of the TSC structure 120. Note that the insulating material may also cover a portion of the first conductive structure 131 and then be removed. Subsequently, a conductive material is deposited to fill the TSH 126 and form the conductive portion 121 of the TSC structure 120. The conductive material may overfill the TSH 126, and a CMP process can be used to remove an overfilled portion of the conductive material.

Further, in some embodiments, a shielding structure, such as the shielding structure 125 in FIG. 1, can be formed in the opening 127. In one embodiment, the shielding structure 125 and the sidewall portion 123 of the TSC structure 120 include a same insulating material and are formed in a same deposition process (note that D1 can be larger than D2). In another embodiment, the shielding structure 125 and the sidewall portion 123 of the TSC structure 120 are formed in separate processes and may or may not include a same material.

Note that in the example of FIG. 2F, the opening 127 is formed in the first region 108, or more precisely, on the boundary of the first region 108 and the second region 109. In another example, the opening 127 can be formed in the first region 108 without being on the boundary. In another example, the opening 127 can be formed in the second region 109 with or without being on the boundary. Accordingly, the TSH 126 and the opening 127 can be formed in separate etching processes.

Figure 3:
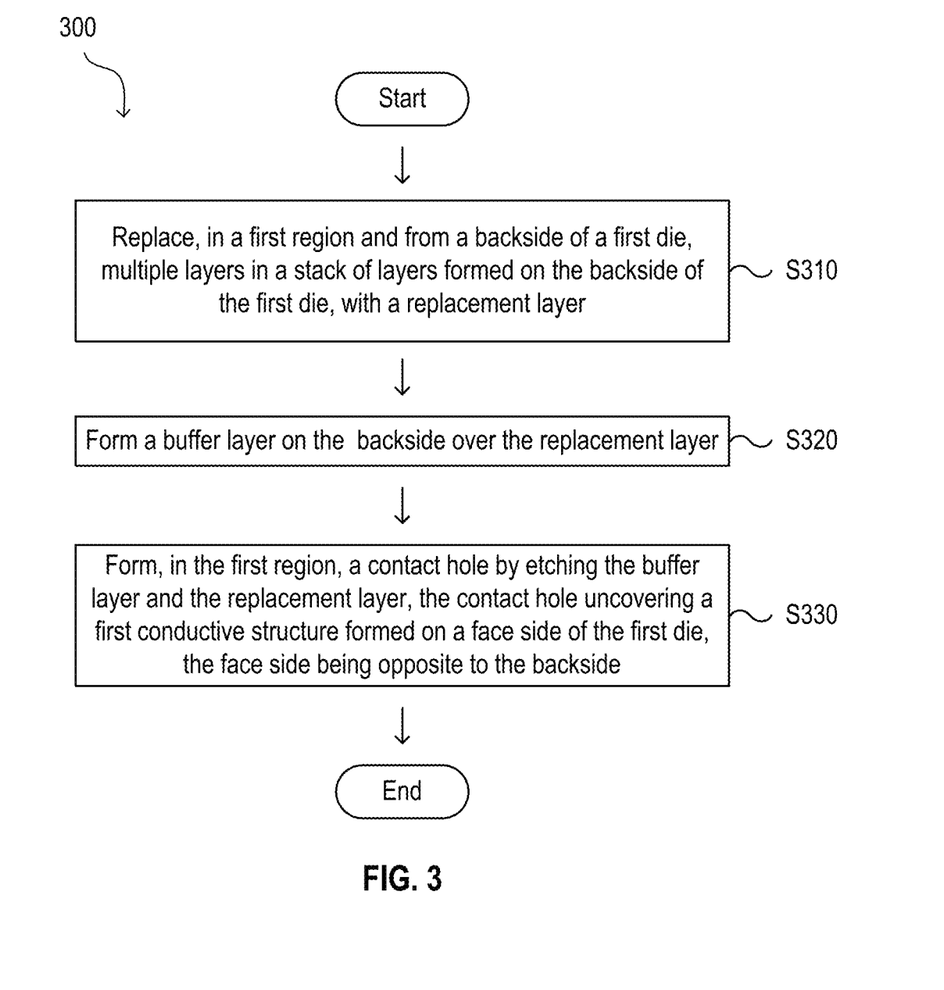
FIG. 3 is a flow chart of a process for manufacturing an exemplary semiconductor device, in accordance with embodiments of the present disclosure.

FIG. 3 is a flow chart of a process 300 for manufacturing an exemplary semiconductor device such as the semiconductor device 100 in FIG. 1, in accordance with embodiments of the present disclosure.

The process 300 begins with Step S310 where, in a first region and from a backside of a first die, multiple layers in a stack of layers formed on the backside of the first die are replaced with a replacement layer. In some embodiments, in order to replace the multiple layers with the replacement layer, a recess is formed in a first region in a stack of layers (e.g. FIGS. 2A-2D). A first etch stop layer of the stack of layers can be a bottom of the recess. Then, the replacement layer is deposited to fill the recess in the stack of layers and cover the stack of layers from the backside of the first die (e.g. FIG. 2E).

In some embodiments, the stack of layers includes a first etch stop layer, a second etch stop layer and a conductive layer. In some embodiments, the forming the recess includes etching, from the backside of the first die based on a mask, a portion of the conductive layer and a portion of the second etch stop layer so that the first etch stop layer is exposed. In some embodiments, a backside of the replacement layer can be planarized, for example by CMP. In some embodiments, the multiple layers in the stack of layers are replaced with the replacement layer having equivalent (e.g. similar or identical) etching properties to the first layer in the stack of layers. In an example, the replacement layer and the first etch stop layer are of a same material (e.g. doped silicon).

The process 300 then proceeds to Step S320 by forming a buffer layer on the backside over the replacement layer (e.g. FIG. 2E). The buffer layer can include an insulating material. The buffer layer can be used to function as a buffer layer and stabilize etching conditions during a future etching process.

At Step S330, a contact hole is formed in the first region by etching the buffer layer and the replacement layer. The contact hole uncovers a first conductive structure formed on a face side of the first die. The face side is opposite to the backside. For example, a TSH can be formed in the first region (e.g. FIG. 2F).

In some embodiments, a contact structure (e.g. a TSC structure) is formed in the contact hole. Specifically, an insulating portion (also referred to as a sidewall portion) of the contact structure is formed on a sidewall of the TSH, and a conductive portion of the contact structure is formed that fills the TSH and contacts the first conductive structure.

In some embodiments, an insulating material is deposited on the sidewall and a bottom of the TSH. The insulating material is then removed from the bottom of the TSH so that the insulating material on the sidewall of the TSH forms the sidewall portion of the TSC structure. Subsequently, a conductive material is deposited to fill the TSH and form the conductive portion of the TSC structure.

In some embodiments, a second conductive structure is formed on the backside of the TSC structure. The second conductive structure is electrically coupled with the first conductive structure via the TSC structure. The second conductive structure can, for example, be configured to include a pad-out structure.

In some embodiments, a shielding structure is formed that extends through the buffer layer, the replacement layer and the first etch stop layer. The shielding structure can includes an insulating material.

In some embodiments, memory cells are formed on the face side of the first die. Peripheral circuitry for the memory cells is formed on a face side of a second die. In an example, the first die and the second die are bonded face to face so that a first bonding structure connected with the first conductive structure in the first die is bonded to a second bonding structure connected with an input/output circuit of the peripheral circuitry in the second die.

It is noted that the semiconductor device 100 can be suitably used in a memory system.

Figure 4:
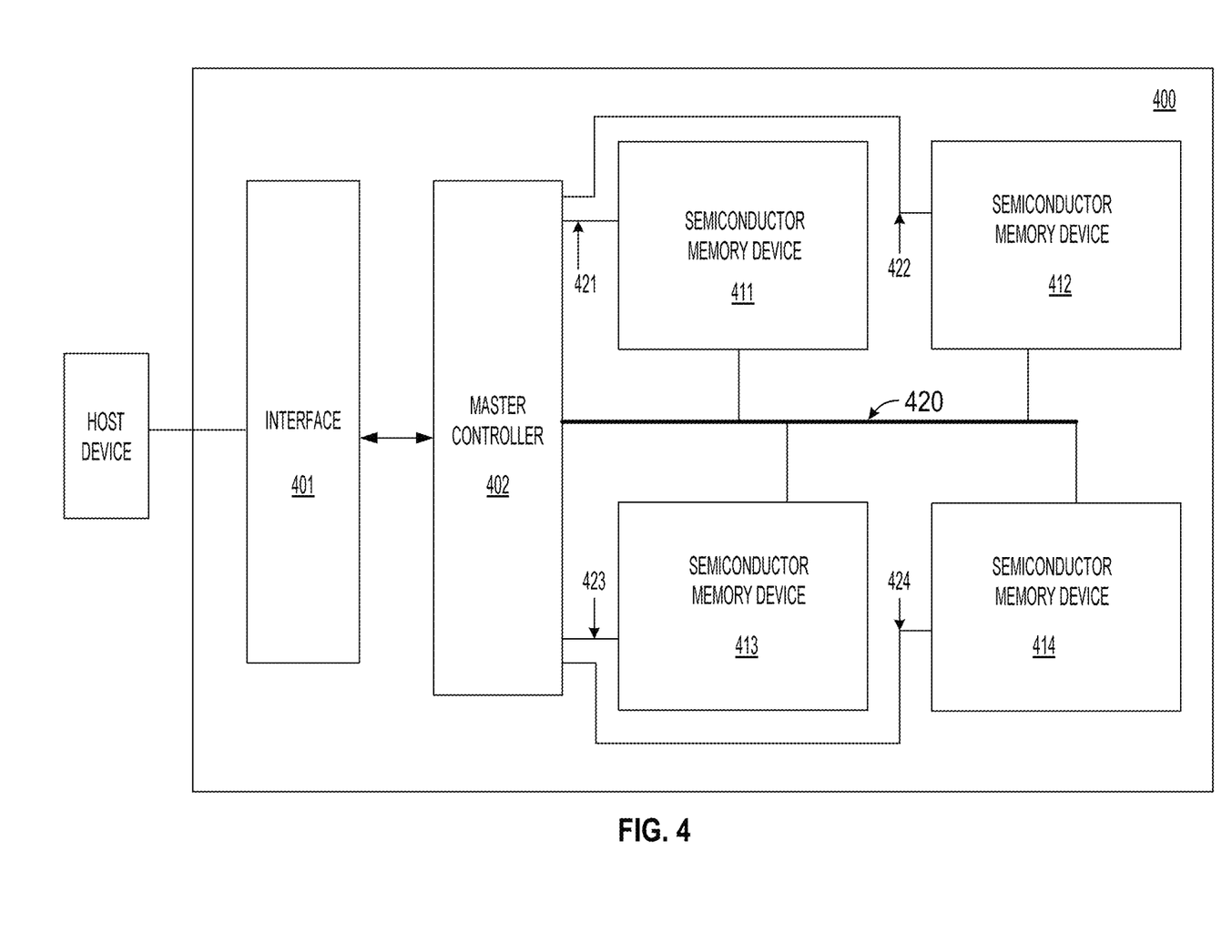
FIG. 4 shows a block diagram of a memory system device, in accordance with some examples of the present disclosure.

FIG. 4 shows a block diagram of a memory system device 400 according to some examples of the present disclosure. The memory system device 400 includes one or more semiconductor memory devices, such as shown by semiconductor memory devices 411, 412, 413 and 414, which are respectively configured similarly to the semiconductor device 100. In some examples, the memory system device 400 is a solid state drive (SSD).

The memory system device 400 can include other suitable components. For example, the memory system device 400 includes an interface 401 and a master controller 402 coupled together as shown in FIG. 4. The memory system device 400 can include a bus 420 that couples the master controller 402 with the semiconductor memory devices 411-414. In addition, the master controller 402 is connected with the semiconductor memory devices 411-414 respectively, such as shown by respective control lines 421, 422, 423 and 424.

The interface 401 is suitably configured mechanically and electrically to connect between the memory system device 400 and a host device, and can be used to transfer data between the memory system device 400 and the host device.

The master controller 402 is configured to connect the respective semiconductor memory devices 411-414 to the interface 401 for data transfer. For example, the master controller 402 is configured to provide enable/disable signals respectively to the semiconductor memory devices 411-414 to active one or more semiconductor memory devices 411-414 for data transfer.

The master controller 402 is responsible for the completion of various instructions within the memory system device 400. For example, the master controller 402 can perform bad block management, error checking and correction, garbage collection, and the like.

In some embodiments, the master controller 402 is implemented using a processor chip. In some examples, the master controller 402 is implemented using multiple microcontroller units (MCUs).

"Device" or "semiconductor device" as used herein generically refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first die comprising:
a first stack of layers in a first region;
a second stack of layers in a second region, the first stack of layers having a smaller number of different layers than the second stack of layers;
a third stack of alternating gate layers and insulating layers in the second region, the first stack of layers being on a same side of the third stack with the second stack of layers;
a first conductive structure in the first region and extending along a first direction, the first conductive structure being on a same side of the first stack of layers with the third stack;
a second conductive structure in the first region, the second conductive structure and the third stack being disposed on opposite sides of the first stack of layers; and
a contact structure formed in the first region, the contact structure extending through the first stack of layers and being configured to conductively connect the first conductive structure with the second conductive structure.

2. The semiconductor device of claim 1, wherein:
the first stack of layers includes, in a sequence, a first layer, a replacement layer and a first insulating layer, and
the second stack of layers includes, in a sequence, the first layer, a second layer, a conductive layer, the replacement layer and the first insulating layer.

3. The semiconductor device of claim 2, wherein:
the first layer and the replacement layer have equivalent etching properties,
the second layer and the first layer have different etching properties, and
the conductive layer and the second layer have different etching properties.

4. The semiconductor device of claim 2, wherein:
the first layer and the replacement layer include a same conductive material.

5. The semiconductor device of claim 2, wherein:
the first layer includes doped silicon, and
the replacement layer includes doped silicon.

6. The semiconductor device of claim 1, wherein:
the contact structure comprises a conductive portion and a sidewall portion,
the conductive portion is configured to conductively connect with the first conductive structure, and
the sidewall portion is configured to insulate the conductive portion from the first stack of layers.

7. The semiconductor device of claim 6, wherein:
the conductive portion includes at least one of tungsten or aluminum.

8. The semiconductor device of claim 6, wherein:
the sidewall portion includes at least one of silicon oxide, silicon nitride, zirconium oxide, hafnium oxide, aluminum oxide or tantalum oxide.

9. The semiconductor device of claim 1, further comprising:
a second die bonded with the first die, the second die including a substrate and peripheral circuitry.

10. The semiconductor device of claim 1, further comprising: a plurality of channel structures extending through the third stack.

11. The semiconductor device of claim 1, further comprising:
a shielding structure extending through at least one of the first stack of layers or the second stack of layers.

12. The semiconductor device of claim 11, wherein:
the shielding structure is positioned on a boundary of the first region and the second region.

13. The semiconductor device of claim 11, wherein:
the shielding structure includes an insulating material.

14. The semiconductor device of claim 6, wherein:
the sidewall portion of the contact structure and the first stack of layers are not integrally formed with each other.

15. A memory system, comprising:
a semiconductor device, comprising:
a die including a contact structure in a first region;
a first stack of layers in the first region;
a second stack of layers in a second region, the first stack of layers having a smaller number of different layers than the second stack of layers;
a third stack of alternating gate layers and insulating layers in the second region, the first stack of layers being on a same side of the third stack with the second stack of layers;
a first conductive structure in the first region and extending along a first direction, the first conductive structure being on a same side of the first stack of layers with the third stack; and
a second conductive structure in the first region, the second conductive structure and the third stack being disposed on opposite sides of the first stack of layers, wherein the contact structure is configured to conductively connect the first conductive structure with the second conductive structure; and
a controller configured to control operations of the semiconductor device, the controller being connected with the semiconductor device.

16. The memory system of claim 15, wherein:
the first stack of layers includes, in a sequence, a first layer, a replacement layer and a first insulating layer, and
the second stack of layers includes, in a sequence, the first layer, a second layer, a conductive layer, the replacement layer and the first insulating layer.

17. The memory system of claim 16, wherein:
the first layer and the replacement layer have equivalent etching properties,
the second layer and the first layer have different etching properties, and
the conductive layer and the second layer have different etching properties.

18. The memory system of claim 16, wherein:
the first layer and the replacement layer include a same conductive material.

19. The memory system of claim 16, wherein:
the first layer includes doped silicon, and
the replacement layer includes doped silicon.

20. The memory system of claim 16, wherein:
the contact structure comprises a conductive portion and a sidewall portion,
the conductive portion is configured to conductively connect with the first conductive structure, and
the sidewall portion is configured to insulate the conductive portion from the first stack of layers.

* * * * *